United States Patent [19]

Emma et al.

[11] Patent Number: 5,584,002
[45] Date of Patent: Dec. 10, 1996

[54] CACHE REMAPPING USING SYNONYM CLASSES

[75] Inventors: Philip G. Emma, Danbury, Conn.; Joshua W. Knight, Mohegan Lake, N.Y.; Keith N. Langston, Ulster Park, N.Y.; James H. Pomerene, Chappaqua, N.Y.; Thomas R. Puzak, Ridgefield, Conn.

[73] Assignee: International Business Machines Corporation, Armonk, N.Y.

[21] Appl. No.: 21,010

[22] Filed: Feb. 22, 1993

[51] Int. Cl.⁶ .................................................. G06F 11/20
[52] U.S. Cl. .......................... 395/403; 395/412; 395/445; 395/492; 364/243.41
[58] Field of Search ..................... 395/445, 403, 395/412, 492, 420, 456; 364/243.41; 371/10.2, 10.3; 365/200

[56] References Cited

U.S. PATENT DOCUMENTS

| | | | |
|---|---|---|---|
| 4,332,010 | 5/1982 | Messina et al. | 395/403 |
| 4,380,797 | 4/1983 | Desyllas et al. | 395/403 |
| 4,388,687 | 6/1983 | Twibell et al. | 395/412 |
| 4,400,770 | 8/1983 | Chan et al. | 395/403 |
| 4,490,782 | 12/1984 | Dixon et al. | 395/463 |
| 4,631,660 | 12/1986 | Woffinden et al. | 395/403 |
| 4,654,790 | 3/1987 | Woffinden | 395/417 |
| 4,680,700 | 7/1987 | Hester et al. | 395/416 |
| 4,797,814 | 1/1989 | Brenza | 395/403 |
| 4,807,110 | 2/1989 | Pomerene et al. | 395/421.03 |
| 4,905,141 | 2/1990 | Brenza | 395/456 |
| 4,989,181 | 1/1991 | Harada | 365/200 |
| 5,070,502 | 12/1991 | Supnik | 371/10.2 |
| 5,153,880 | 10/1992 | Owen et al. | 371/10.2 |
| 5,161,157 | 11/1992 | Owen et al. | 371/10.2 |
| 5,179,536 | 1/1993 | Kasa et al. | 365/200 |
| 5,270,975 | 12/1993 | McAdams | 371/10.3 |
| 5,295,101 | 3/1994 | Stephens et al. | 365/200 |
| 5,327,380 | 7/1994 | Kersh, III et al. | 365/195 |
| 5,471,478 | 11/1995 | Mangan et al. | 371/10.3 |

FOREIGN PATENT DOCUMENTS 1-142844  5/1989  Japan .

OTHER PUBLICATIONS

"Cache Memory Organization to Enhance the Yield of High–Performance VLSI Processor"–Sohi, member, IEEE––IEEE Transactions on Computers–Apr. 1989–pp. 484–492.
"Architecture of a VLSI Instruction Cache for a RISC–"–Patterson et al.–Computer Architecture News–vol. 11, No. 3, Jun. 83–pp. 108–116.
"A Case for Direct–Mapped Caches", by Mark D. Hill; Dec. 1988; pp. 25–40.

Primary Examiner—Gary Chin
Assistant Examiner—Tyrone V. Walker
Attorney, Agent, or Firm—Ratner & Prestia

[57] ABSTRACT

A method for addressing data in a cache unit which has a plurality of congruence classes, following a failure which disables one or more of the congruence classes in the cache unit. A plurality of synonym classes are established. A subset of the congruence classes is assigned to each of the synonym classes. Any disabled congruence classes are identified. The synonym class to which the disabled congruence class belongs is identified. An alternate congruence class is selected which belongs to the same synonym class as the disabled congruence class. When a request is received by the cache to store a line of data into the disabled congruence class, the line is stored into the alternate congruence class in response to the request.

12 Claims, 5 Drawing Sheets

CACHE REMAPPING USING SYNONYM CLASSES

BACKGROUND OF THE INVENTION

1. Field of the Invention

The present invention relates generally to cache memory systems, and in particular, to mechanisms for accommodating hardware failures which disable a subset of the cache storage elements.

2. Description of the Related Art

High performance processors have used cache memory systems as an integral component of overall system design for many years. A cache memory typically has a much faster access time than main storage. For example, cache may make use of a relatively small number (N) of high-speed data storage elements, located in close proximity to an associated processor, while main storage typically uses larger numbers of storage elements and is located at some distance from the processor. Cache memory systems have been designed to overcome the access speed limitation of main storage by providing rapid access to a relatively small set of data which is likely to be used during a relatively short time interval.

If a datum with a given address can be stored in any location within the cache (a fully associative cache) access time is relatively slow, because of the large number of address comparisons required to find the datum. To provide rapid access to data in the cache, most caches limit the number of locations within the cache into which a datum with a given virtual address may be stored. The set-associativity of the cache determines the number of locations in the cache into which a datum with a given address (in main memory) can be placed. The set-associativity of the cache is an important design parameter, influencing the access speed and the cache hit ratio.

Set associative caches are commonly used. In a set associative cache, a datum with a given address may be stored in one of a limited group of locations in the cache, known as a congruence class. The directory for such a cache will include a row of addresses for each congruence class. To access data in the cache, the addresses in the row are compared to the desired address in parallel, to determine whether the desired datum is stored in the cache in any of the locations within the congruence class. Logic is required to determine which, if any, of the addresses match the desired address. Because a given datum can be stored in more than one location, a replacement strategy may be implemented to retain data in the cache which is likely to be accessed, improving the cache hit ratio.

When the set associativity is 1, the cache is said to be direct mapped. FIG. 1 shows a conventional direct mapped cache. That is, the congruence class only includes one location for a datum with a given address. FIG. 1 also shows a conventional apparatus for addressing data in a direct mapped cache unit 100. Cache unit 100 includes a cache directory 110 and a cache memory 112. The cache memory includes a plurality of rows, 108$a$–$n$, each row including a line of data. Each row 108$a$–$n$ forms a congruence class with a single set or location within the row into which a given datum may be stored. The cache directory includes entries 180$a$–$n$ which are associated with respective rows 108$a$–$n$. Entries 180$a$–$n$ include address tags 105$a$–$n$ which store the high order bits of the respective addresses (in main memory) of the requested data stored in respective rows 108$a$–$n$. Valid bits 103$a$–$n$ indicate whether the data in the associated cache memory storage elements 108$a$–$n$ are valid. There is also a one-for-one correspondence between the low order bits 116 of the requested address and the entries 180$a$–$n$ in directory 110, so that it is unnecessary to store the low order bits of the address in entries 180$a$–$n$.

Because cache 100 is direct mapped, identification of a row in cache memory 108$a$–$n$ is sufficient to determine where a given datum is stored. Because cache 100 uses real placement, the translated ADHIGH bits 114 of the translatable portion of the address are stored in the address tag 105$a$–$n$.

When a datum 120 is requested by the processor 140, the low order bits of the address in ADLOW 116 are used to select a row in directory 110 to check. The directory entry 180$a$–$n$ contains an address tag which comprises the high order bits of the address in main memory in which the data in the associated cache memory line 105$a$–$n$ are stored. The address tag 180$a$–$n$ is compared to ADHIGH 114 at the same time that valid bit 103$a$–$n$ is checked. If the addresses match and the data is valid, then there is a cache hit and the associated cache memory entry 108$a$–$n$ is provided to the processor 140.

The direct mapped structure has a very fast access latency, because for any desired datum, only one address in the cache directory must be compared to the desired address to determine whether the datum is in the cache. The direct mapped cache may also be less expensive, because the logic used in a set-associative cache to perform multiple compares within each congruence class is not needed. For some applications, the faster cache access speed of a direct mapped cache outweighs the slightly higher (relative to set-associative mapping) cache miss rate.

Nonetheless, direct mapped caches have not been used as widely as set-associative caches. One reason is the inability of a direct mapped cache to accommodate hardware failures. If a location in the cache is subject to a hard failure (a failure of a storage element, the electrical path connecting the element, or the logic that is used to access the element), then data which map to the failed location in the cache cannot be stored in the cache at all. Any reference to data which map to the failed location results in a cache miss; the data must be fetched from main memory, which has a much longer access time than cache.

While set-associative caches are more reliable, they are not immune to failure. The loss of a single storage element in a set associative cache only disables one set of the congruence class. But a failure in one of the lines used to access the congruence class may result in the loss of an entire congruence class, even in a set associative cache.

Another aspect of cache memory design is the determination of the number of congruence classes. The simplest method to increase the size of a cache memory is to increase the number of congruence classes without changing set associativity. So long as the number of bits required to uniquely identify the congruence class does not exceed the number of non-translatable bits in the virtual address, the non-translated (virtual) address may be used to request data from the cache. This is faster than using the real (translated) address to access the cache, because there is a delay associated with address translation.

When the number of congruence classes grows so large that the number of bits in the non-translated portions of the address is insufficient to uniquely identify the congruence class, then the requesting address expands into the translated field. This results in formation of cache synonym classes. A synonym class includes a plurality of congruence classes whose addresses have the same non-translatable address field but different low order bits within the translatable address field. If the virtual address is used to search for a datum in the cache, it is possible that the wrong congruence class within the synonym class is checked. The system responds as if there is a cache miss, even though the desired datum is actually present in the cache in another congruence class different from the class addressed by the request.

The existence of cache synonym classes has generally been regarded as a problem in cache design, and a number of systems have been disclosed to detect the existence of synonym classes, so that virtual addresses may be used for retrieving data from the cache. Such systems are discussed in U.S. Pat. Nos. 4,332,010 to Messina and 4,400,770 to Chan et al.

SUMMARY OF THE INVENTION

The present invention is embodied in a method for addressing data in a cache memory unit following a failure which disables one of the congruence classes in the cache. The cache memory unit is adapted for use in a digital processor system. The cache memory unit has a plurality of congruence classes.

A plurality of synonym classes are established. A respective subset of the congruence classes is assigned to each of the synonym classes. The congruence class which has been disabled by the failure is identified. The synonym classs to which this congruence class is assigned is identified. A further congruence class assigned to the identified synonym class is selected as an alternate congruence class.

A request to store a line of data into the disabled congruence class is identified. The line of data is stored into the alternate congruence class in response to the request.

DESCRIPTION OF THE EXEMPLARY EMBODIMENTS

OVERVIEW

The present invention is embodied in a cache system in which a hardware failure that disables a congruence class is accommodated by remapping data to an alternate congruence class within the group of congruence classes assigned to the same synonym class as the affected congruence class.

Figure 2:
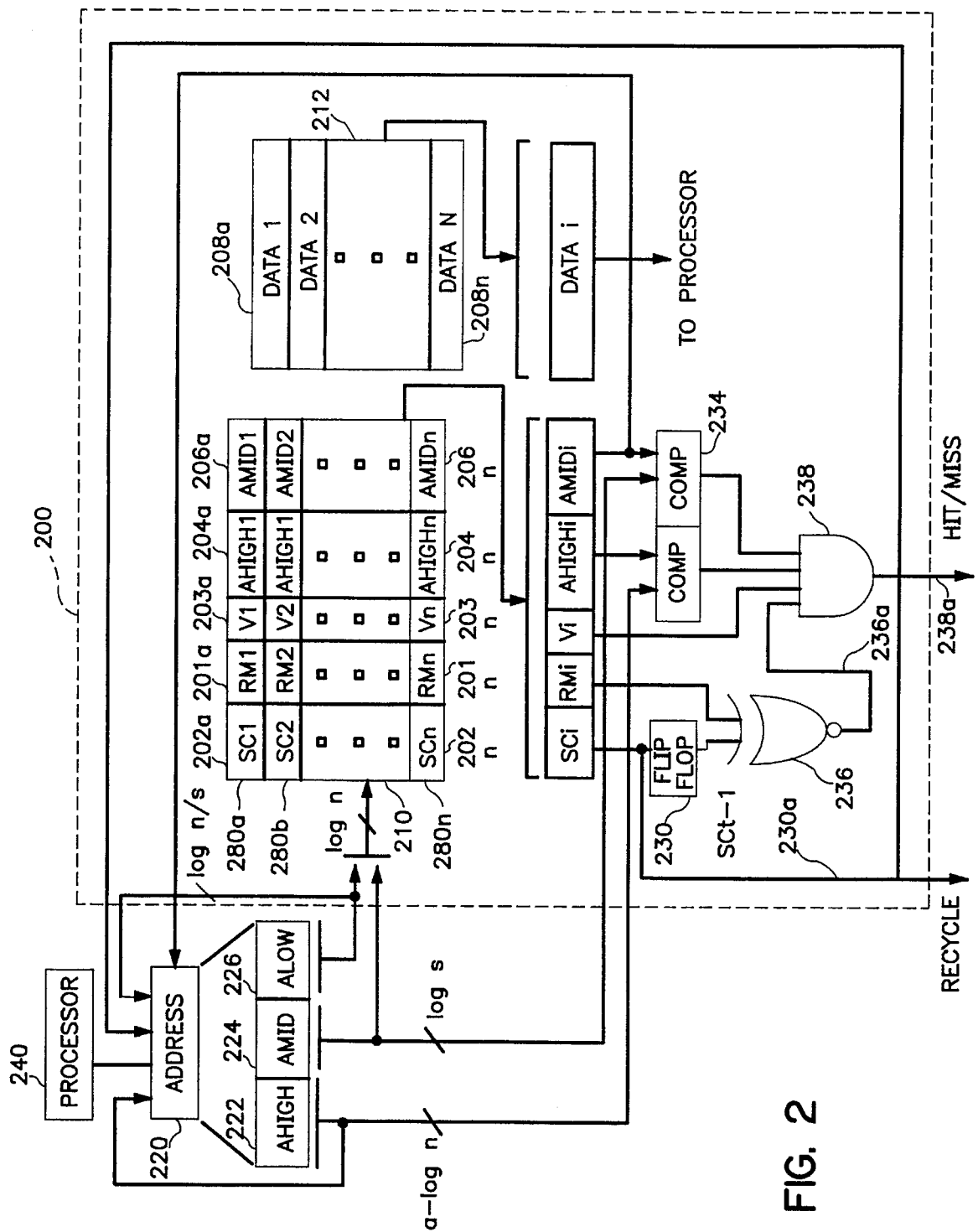
FIG. 2 shows an exemplary embodiment of the invention.

FIG. 2 shows a cache unit 200 suitable for use in an exemplary cache memory in accordance with the present invention. The cache unit 200 includes a cache directory 210 with addressing information 204a–n and 206a–n and a cache memory 212, in which lines of data are retained. The embodiment of the invention shown in FIG. 2 is adapted for use in a system with a direct mapped cache memory. In a direct mapped cache, a word (datum or instruction, referred to as a datum) with a given virtual address in main memory has a single congruence class in the cache memory into which the datum is stored.

The cache directory includes, for each congruence class, an entry 280a–n with an AHIGH field 204a–n for the high order bits 222 of the address 220. Cache memory 212 includes respective lines 208a–n for storing data from the locations in main memory (not shown) associated with the respective congruence classes. The low order bits 226 of the address 220 of the datum are implicit in the location of the congruence class in directory 210 and cache memory 212. Valid bits 203a–n identify whether the data in the associated lines 208a–n of cache memory 212 is valid. AHIGH fields 204a–n, data lines 208a–n and valid bits 203a–n are similar to respective fields 180a–n, lines 108a–n and valid bits 103a–n in the conventional cache shown in FIG. 1. Mapping into this single congruence class, defined solely by the address used to store the data in main memory, is referred to as "canonical mapping."

Figure 1:
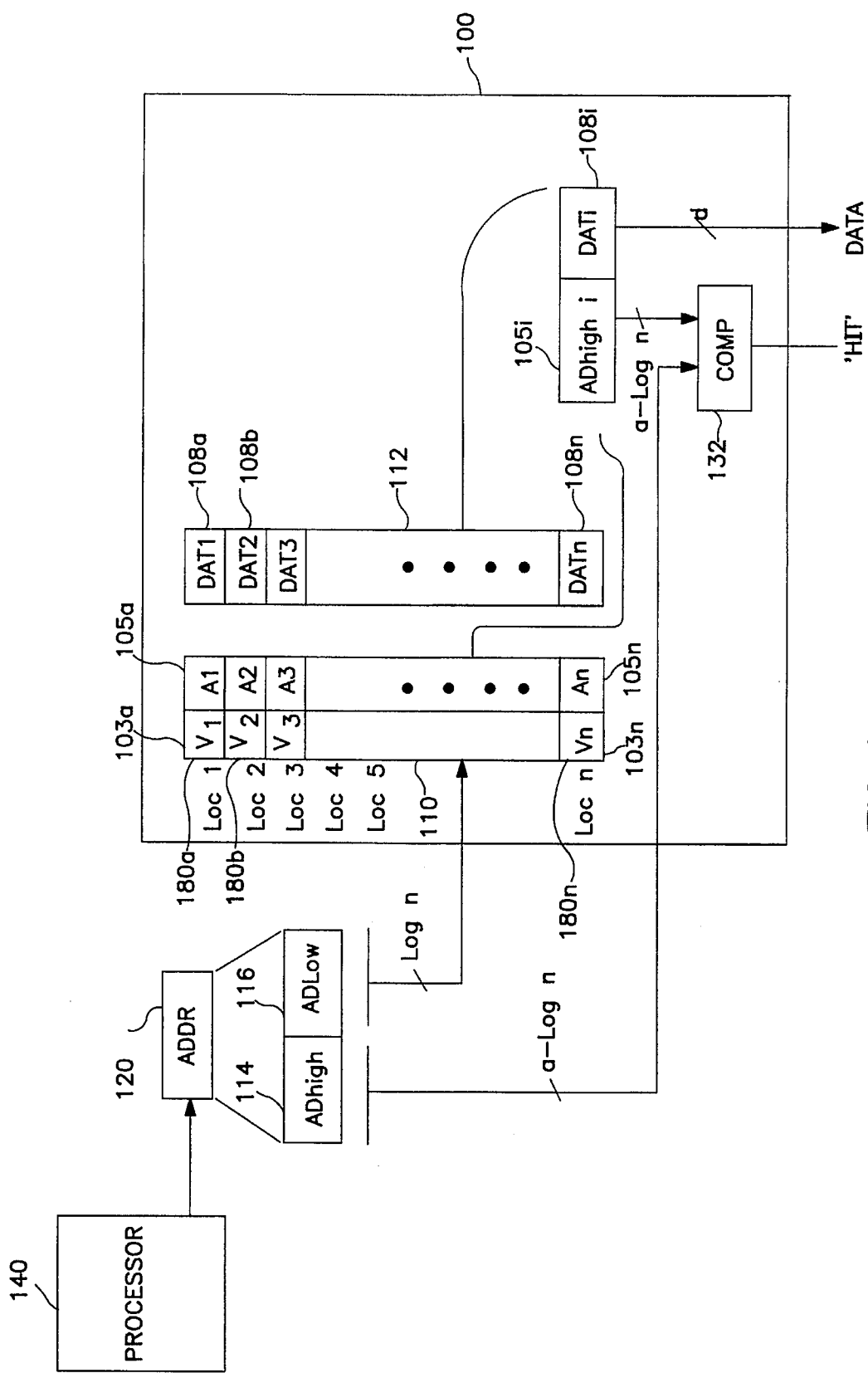
FIG. 1 show a prior art cache unit.

Cache directory 210 includes three additional fields in the respective entries 280a–n for each congruence class, which are not present in the cache unit shown in FIG. 1. The first added field is the synonym class (SC) field 202a–n. The SC field 202a–n indicates whether there is a hardware failure which has disabled the congruence class associated with each entry 280a–n. The second added field is the Remapped Data (RM) field 201a–n. The RM field 201a–n stores an indicator which indicates whether the congruence class is an "alternate congruence class" which contains data that have been remapped from a disabled congruence class. The third added field is the AMID field 206a–n. AMID 206a–n includes additional bits from the address 220 which are used to locate data in the cache. If references to a given disabled congruence class are remapped to an alternate congruence class within the same synonym class, the AMID field 206a–n identifies that alternate congruence class. Replacing a portion 224 of the address 220 of the datum requested by the processor with the value stored in AMID 206a–n for the associated cache entry 280a–n causes the directory to point to the alternate congruence class.

Figure 3:
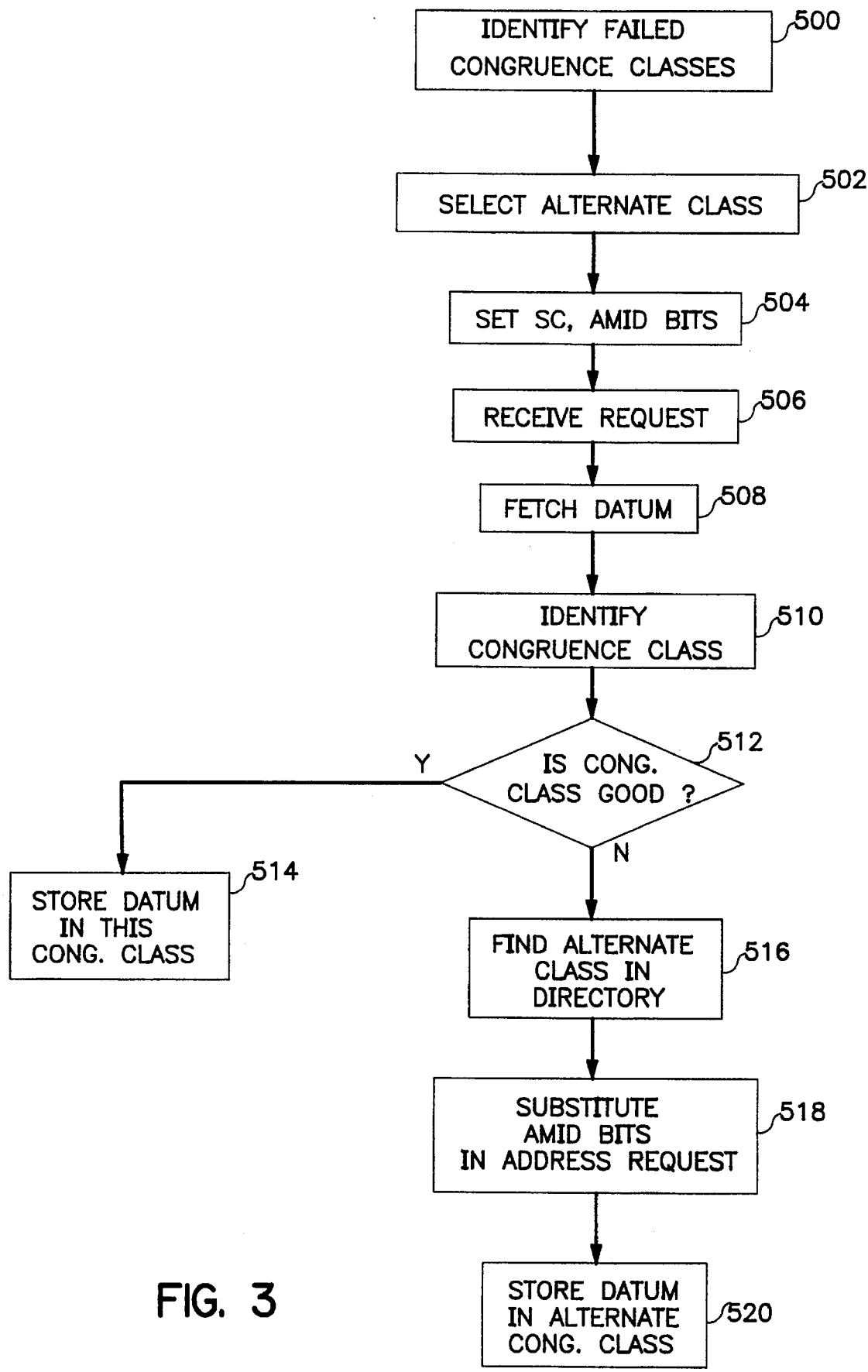
FIG. 3 is a flow diagram of a process for storing data in accordance with the invention.

FIG. 3 is a flow diagram showing an exemplary method in accordance with the present invention. In the exemplary embodiment of FIG. 2, each synonym class includes four congruence classes. That is, there may be four locations in the cache memory for any given ALOW field 226 value. Consequently, the AMID field 206a–n includes two of the higher order bits from the address.

At step 500, during the power-on sequenced the cache memory 212 is checked for hardware failures. The processor determines whether there is a hardware failure in the storage element 208a–n associated with any congruence class. If there is a failure, at step 502, recovery software in the processor selects an alternate congruence class within the same synonym class as the congruence class disabled by the hardware failure. At step 504, the SC field 202a–n for the disabled congruence class is set to a value to indicate that a failure has been detected. The AMID field 206a–n for the disabled congruence class is set to a value associated with the alternate congruence class. Data from the address in main memory that normally would be mapped to the disabled congruence class (by canonical mapping) may now be stored in cache memory 212 in the alternate congruence class.

At step 506, the processor issues a request for a datum. At step 508, the datum is fetched from the main memory (not shown) in response to a processor request. The datum is a candidate for storage in the cache 200. At step 510, the low order bits 226 of address 220 are examined. The low order bits 226 identify the congruence class in which the datum may be stored. At step 512, if there is no hardware failure in that congruence class, than at step 514, the datum is stored in the congruence class defined by canonical mapping.

If, however, at step 512, a hardware failure has disabled the storage element 208a–n associated with this congruence class, then at step 516, the AMID field 206a–n identifies the alternate congruence class to which this congruence class is remapped. At step 518, the value in AMID 206a–n is substituted for the middle bits 224 of the address 220. At step 520, the datum is stored in cache memory 212 in the alternate congruence class defined by the low order bits 226 and the substituted middle bits 224. The RM field 201a–n is set in the alternate congruence class to indicate that the data stored in this line of the cache was stored by remapping, and not by canonical mapping.

Figure 4:
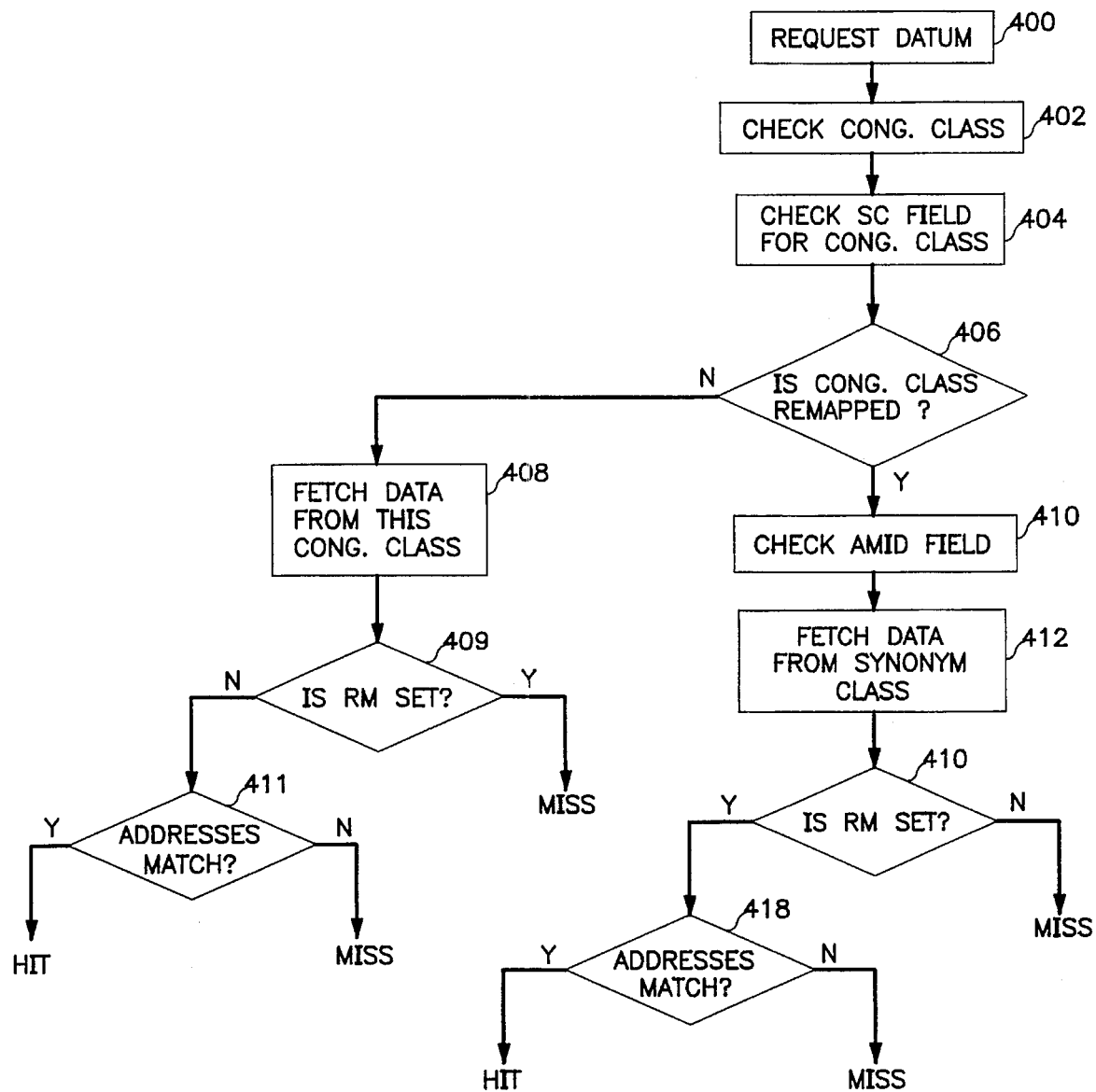
FIG. 4 is a flow diagram of a process for retrieving data in accordance with the invention.

FIG. 4 is a flow chart of a method for retrieving data from cache memory 212 following remapping. At step 400, the cache 200 receives a processor request for data from address 220 (as shown in FIG. 2. At step 402, the congruence class is determined from the low order bits 226 of the address 220. At step 404, the SC field is checked to determine whether this congruence class has a hardware failure. At step 406, if no failure is indicated (no remapping has occurred), then the requested data may be in the cache in the canonical congruence class; at step 408, an address compare for the high order address bits 222 is performed similar to the method used for a conventional cache. At step 409, the RM field 201a–n is checked. At step 409, if RM 201a–n is not set, an address tag comparison is performed at step 411. If the addresses match at step 411, there is a cache hit. If the RM field 201a–n is set at step 409, then the data in the line of the cache is not from the desired line, but has been remapped from another congruence class, so a miss is detected. In other words, this congruence class is the alternate congruence class for a disabled congruence class within the same synonym class.

If a hardware failure is detected at step 406 (remapping has occurred), then at step 410, the AMID field 206a–n is read from the directory 210 and substituted for the middle bits 224 of the requested virtual address. At step 412, the value of AMID 206a–n is used to identify the alternate congruence class in which the requested data may be stored. The processor will wait for another cache cycle, while the directory 210 entry 280a–n associated with the alternate congruence class is checked. At step 416, the RM field 201a–n of the alternate congruence class is checked. If the address tag (which includes the AHIGH field 204a–n) of the entry 280a–n matches desired value 222 and RM 201a–n is set then there is a cache hit in the alternate congruence class. If RM 201a–n is not set, then the data stored in the alternate congruence class are not remapped from the disabled congruence class and there is a miss. At step 418, if the RM field is set but the address is not the desired address tag, there is a miss.

DETAILED DESCRIPTION

The first exemplary embodiment of the invention is adapted for use in a synonym free direct mapped cache with real placement.

FIG. 2 shows an exemplary embodiment of the present invention. In this embodiment, the cache memory 212 is direct mapped with real placement, as is cache memory 112 shown in FIG. 1. Cache memory 212 has N congruence classes which are assigned to S synonym classes, with S being less than N. A real placed cache is inherently synonym free, so a plurality of synonym classes are created and a respective subset of the congruence classes are assigned to each synonym class. Since the purpose of implementing the synonym classes is only to accommodate hardware failures, it is typically sufficient for S to be equal to two or four. In order to implement the invention, synonym classes are established, as would be accomplished by one of ordinary skill in the art, even if the cache has few enough congruence classes to be synonym free (i.e., even if the total number of bits used to reference the congruence class contained in the AMID 224 and ALOW 226 fields is greater than or equal to $\log_2 N$). Directory 210 has a plurality of entries 280a–n, each respective entry 280a–n associated with a respective congruence class.

Each time the cache unit 200 is powered on, a memory check is performed, as is commonly known in the art. During this memory check, if a cache memory 212 hardware failure is detected (e.g., failure of a conductive path which disables a congruence class) in the $i^{th}$ congruence class, then the SC bit 202i of the directory entry associated with the failed line is set to one. The processor 240 selects an alternate congruence class within the same synonym class as the affected congruence class, and stores the identification (AMID) bits which identify the alternate congruence class in the AMID field 206i of the entry for the congruence class disabled by the failure. The SC field 202i and the AMID field 206i retain the values set during the power on sequence until the cache unit 200 is powered off to identify the alternate congruence class.

When a datum is to be stored in the cache (e.g., following a cache miss) from a particular address in main memory, $\log_2 N$ bits of the address are used to identify the location in the cache in which the datum may be stored. Of the $\log_2 N$ bits, $\log_2 S$ bits are used to identify the congruence class within the synonym class, and $\log_2 N - \log_2 S$ bits identify the synonym class.

For example, if there are 128 lines in the cache memory 212 (N=128) then 7 bits are sufficient ($\log_2[128]=7$) to uniquely identify the 128 congruence classes. The least significant 5 bits of the address form the ALOW part of the address 226 and the next 2 bits ($\log_2 4=2$) of the addresss form the AMID field 224.

The cache directory 210 entry 280i (designated by the index "i") associated with the values in AMID 224 and ALOW 226 is checked to determine the value of the SC bit. If the SC bit 202i is reset to zero, then there is no hardware failure in this congruence class. The desired datum may be stored in the associated cache memory storage element 208i and the associated valid bit 203i in the directory entry 280i is set to one.

If the SC bit 202i is set to one, then the request is for storage in a disabled congruence class and the datum to be stored in the cache memory 212 must be stored in the alternate congruence class (designated by subscript "j"). The AMID 206i field of the directory 210 entry for the alternate congruence class is substituted for the AMID portion 224 of the address requested. The datum is then stored in the storage element 208j associated with the alternate congruence class, and the address tag (AHIGH 222 and the substituted AMID value 224) is stored in respective fields 204j and 206j of the directory entry 280j for the alternate congruence class. The values in the RM bit 201j and valid bit 203j of the alternate congruence class entry are each set to one. The datum is successfully stored in the cache.

When the processor subsequently requests retrieval of a datum stored in the cache, the cache directory 210 entry associated with, the requested values in AMID 224 and ALOW 226 is checked to determine the values of the SC 202$i$ and RM 201$i$ indicator bits. The RM field 201$i$ stores an indicator which identifies whether there are data stored in this congruence class which were remapped from a failed congruence class.

The value of the SC field 202$i$ is stored in a flip-flop 230 for one cycle and the value $SC_{t-1}$ from the previous cycle is input to an EXCLUSIVE-NOR gate 236, along with the RM value from 201$a$–$n$. If $SC_{t-1}$ and RM are different, the output value 236$a$ from gate 236 is 0, and there is a cache miss. If $SC_{t-1}$ and RM have the same value, the output value 236$a$ from gate 236 is 1, and there may be a cache hit. Address tag fields 204$a$–$n$ in the directory 210 entry 280$i$ are compared with respective request fields AHIGH 222 and AMID 226 in respective comparators 232 and 234. If the EXCLUSIVE-NOR output value 236$a$ and the valid bit Vi 203$i$ are both set to one and address tags match (AHIGH 222 matches AHIGH 204$i$ and AMID 224 matches AMID 206$i$) then there is a cache hit. If any of these conditions is not met, AND gate 238 will provide a zero output signal 238$a$.

In the case where $SC_{t-1}$ and RM are each reset to zero, then the desired congruence class is functioning properly and any data stored in the $i^{th}$ congruence class were placed in the cache by canonical mapping (i.e., the $i^{th}$ class is the primary congruence class). The address tag comparison for this case is similar to that in the cache shown in FIG. 1.

In the second case, $SC_{t-1}$ is set to one and RM is reset to zero. This can occur when the primary congruence class is disabled by a hardware failure. When a request is received for data from a disabled congruence class in which the SC field 202$i$ is set to one, A RECYCLE signal 230$a$ is sent to the processor, along with the AMID value 206$i$ in the directory entry 280$i$. In response to the recycle signal, the processor again requests the datum, except that the AMID value stored in 206$i$ is substituted for the AMID field 224 in the request. When this request is received by the cache unit 200, $SC_{t-1}$ is set to one and RMj 201$j$ may be either zero or one. If RMj is reset to zero, then the data contained in the alternate congruence class storage element 208$j$ are not the desired data and were not placed in element 208$j$ by remapping. The $j^{th}$ congruence class is the primary class for the data currently stored in element 208$j$.

In the third case, $SC_{t-1}$ and RM are each set to one. This can also occur when a hardware failure is involved. As in the second case, when a request is received for data from a congruence class in which the SC field 202$i$ is set to one, A RECYCLE signal 230$a$ is sent to the processor, along with the AMID value 206$i$ in the directory entry 280$i$. In response to the recycle signal, the processor again requests the datum, except that the AMID value stored in 206$i$ is substituted for the AMID field 224 in the request. When this request is received by the cache unit 200, $SC_{t-1}$ is set to one. If RMj 201$j$ is set to one, then whatever data are stored in element 208$j$ were stored there as a result of remapping from a congruence class other than the $j^{th}$ class. This may result in a cache hit, if other conditions are met. The data in the element 208$j$ may or may not be from the desired $i^{th}$ congruence class. If there are more than two congruence classes in a synonym class, then the data stored in element 208$j$ may also have been remapped from one of the remaining two congruence classes within the same synonym class (e.g. the $k^{th}$ congruence class). Such a condition is detected by comparator 234, which determines whether the data in element 208$j$ was remapped from the $i^{th}$ congruence class. If there are valid data from the $i^{th}$ congruence class, then there is a cache hit.

The fourth possible condition is the one in which $SC_{t-1}$ is reset to zero but RM is set to one. This can occur if the primary ($i^{th}$) congruence class is functioning properly, but is serving as the alternate congruence class for a disabled class. For example, assume a condition in which the $i^{th}$ congruence class is functioning properly, and the processor issues a request for a datum which maps to the $i^{th}$ class. The $j^{th}$ congruence class has failed and is remapped to the $i^{th}$ class; a line of data which would be canonically mapped to element 208$j$ is remapped to element 208$i$. Upon receiving the request for a datum that canonically maps to element 208$i$, the condition will result that $SC_{t-1}$ is reset to zero but RM is set to one. The output signal 236$a$ of EXCLUSIVE-NOR gate 236 is reset to zero, and a cache miss is determined from the output signal 238$a$ of AND gate 238 (even though the data in element 208$j$ are valid).

Figure 5:
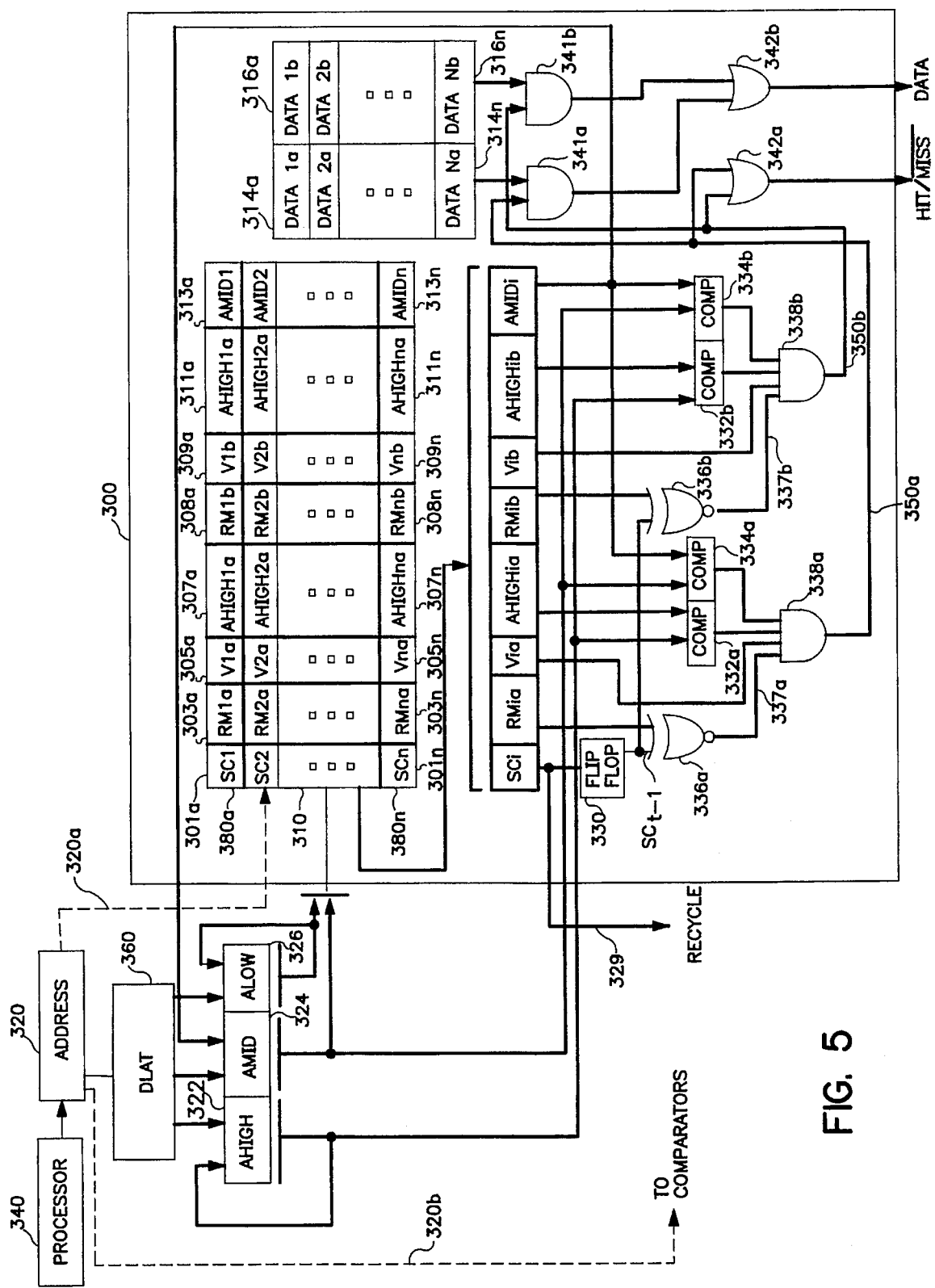
FIG. 5 shows a further exemplary embodiment of the invention.

Further exemplary embodiments of the invention include cache memory systems which are set associative and cache memory systems which use virtual placement. FIG. 5 shows a system which is associative and which uses real placement.

FIG. 5 shows a system which has a processor 340, a conventional dynamic lookaside address translator (DLAT) 360, and an associative cache unit 300 which includes a cache directory 310 and a cache memory 312. In the exemplary embodiment, each congruence class includes two sets. That is, there are address tags 307$a$–$n$ and 311$a$–$n$ and two valid bits 305$a$–$n$ and 309$a$–$n$ in the directory 310. Each congruence class also contains two associated data lines 314$a$–$n$ and 316$a$–$n$. It is understood by those skilled in the art that the cache may be dimensioned with a larger number of sets in each congruence class, and the discussion for two sets can be generalized for K sets.

In this embodiment, the page size in memory is assumed to be 4096 bytes, so that 12 bits are required to identify a byte within the page (i.e., the portion of the address which does not require translation). The cache memory 312 has 128 byte lines, so that 7 bits are required to identify a byte within a line. Finally, the cache has 128 congruence classes, so that 7 bits are required to determine into which congruence class a line of data is stored. Since 7 plus 7 or 14 bits are required to identify the location of a datum in the cache, the cache would not be inherently synonym free if cache placement were based only on the virtual address. Therefore, the congruence class into which data are stored is selected after address translation. The DLAT 360 has storage elements in which recently used address translations are stored. Given a request from the processor for data from a desired virtual address, the DLAT 360 can rapidly provide the real address if the data have been referenced recently. The above mentioned 14 bits are assigned to the AMID 324 and ALOW 326 fields, so that the 12 least significant bits are in ALOW 326 and the 2 most significant bits are in AMID 324. The 17 most significant bits of the address (the remaining bits which must be translated) are in AHIGH 322.

As in the embodiment of FIG. 2, the address tags in the cache are expanded to include both AHIGH 307$a$–$n$ and 311$a$–$n$ and AMID 313$a$–$n$ fields. ALOW is implicit in the congruence class selection. The 2 bits assigned to AMID 313$a$–$n$ define four synonym classes in a manner similar to the embodiment of FIG. 2. For a given entry 380$i$ in the directory associated with a single congruence class, only one value of AMID 313$i$ is needed, since AMID is the same for both sets within the congruence class. Because the set associativity of cache 300 is two, the Remapped data (RM), Valid (V) and Address tag (AHIGH) fields are duplicated for each set in the cache. Increasing the set associativity beyond two would require a commensurate increase in the number of each of these fields.

The labelling of a failed congruence class during the power-on sequence is similar to the labelling for the embodiment shown in FIG. 2 and discussed above. Each time the cache unit 300 is powered on, a memory check is performed. If a cache memory 312 hardware failure is detected in the $i^{th}$ congruence class, then the SC bit 301$i$ of the directory entry associated with the failed congruence class is set to one. The processor 340 selects an alternate congruence class within the same synonym class as the affected congruence class, and stores the identification (AMID) bits associated with the alternate congruence class in the AMID field 313$i$ of the entry 380$i$ for the disabled congruence class. The SC field 301$i$ and the AMID field 313$i$ retain the values set during the power on sequence until the cache unit 300 is powered off. The processor selects an alternate congruence class within the same synonym class as the failed congruence class. The value of AMID associated.

When a datum is to be stored in cache 312, the 14 low order bits of the address, including AMID 324 and ALOW 326 are used to select the congruence class.

The cache directory 310 entry (designated by the index "i") associated with the values in AMID 324 and ALOW 326 is checked to determine the value of the SC bit. If the SC bit 301$i$ is reset to zero, then there is no hardware failure in this congruence class. The desired datum may be stored in one of the associated cache memory storage elements 314$i$ or 316$i$ and the respective valid bit 305$i$ or 309$i$ in the directory entry is set to one. If either element 314$i$ or 316$i$ already is holding data, then a conventional replacement scheme (e.g., least recently used) is used to select the data to replace.

If the SC bit is set to one, then the datum to be stored in the cache memory 312 must be stored in the alternate congruence class (designated by subscript "j"). The alternate congruence class is determined by substituting the AMID 313$j$ field of the directory 310 entry for the alternate congruence class for the original AMID portion 324 of the address requested. The datum is then stored in the storage element 314$j$ (or 316$j$) associated with the alternate congruence class, and the address tag (AHIGH 322 and the originally requested AMID value 313$i$ of the affected congruence class) is stored in respective fields 307$j$ (or 311$j$) and 313$j$ of the directory entry for the alternate congruence class. The values in the RM bit 303$j$ (or 308$j$) and valid bit 305$j$ (or 309$j$) of the alternate congruence class entry are each set to one. If both of the sets 314$j$ or 316$j$ of the alternate congruence class contain valid data, a known replacement strategy (e.g. least recently used) is used to determine which set of data in the alternate congruence class are replaced by the data remapped from the disabled congruence class. The datum is successfully stored in the cache.

The four different states discussed above with respect to the embodiment of FIG. 2 (for the different values of $SC_{t-1}$ and RM also applicable to the associative cache shown in FIG. 5. In cache 300 however, the RM bits 303$a$–$n$ and 308$a$–$n$ may be set independently of one another. When data are remapped into the alternate congruence class J, the RM bits are only set to 1 for the set(s) within the alternate congruence class J which actually store remapped data. It is thus possible for congruence class J to contain only canonically mapped data (Both RM bits 303$j$ and 308$j$ are reset). Class J may contain only remapped data (Both RM bits 303$j$ and 308$j$ are set to 1). Or class J may contain a combination of remapped and canonically mapped data (Bit 303$j$ is set and bit 308$j$ reset, or bit 303$j$ is reset and bit 308$j$ set). For example, if RMja 303$j$ is set to 1 and RMjb 308$j$ is reset to zero, then cache storage element 314$j$ has remapped data (remapped from the failed congruence class identified by the value stored in AMID 313$j$). Cache storage element 316$j$ has canonically mapped data.

When the processor subsequently requests a datum stored in the cache, the cache directory 310 entry for the congruence class associated with the requested values in AMID 324 and ALOW 326 is checked to determine the values of the SC 301$i$ and RM 303$i$ and 308$i$ bits. The SC field 301$i$ identifies whether the $i^{th}$ congruence class is functioning normally (SC=0) or has failed (SC=1). The RM fields 303$i$ and 308$i$ identify whether there are data stored in this congruence class which were remapped from a failed congruence class. When an SC value of 1 is detected, then a recycle signal 329 is sent to the processor. On the next cache cycle, a request for data from the alternate congruence class is made by requesting data from the congruence class identified by the AMID 313$i$ field in the failed congruence class.

The value of the SC field 301$i$ is stored in a flip-flop 330 for one cycle and the value $SC_{t-1}$ from the previous cycle is input to an EXCLUSIVE-NOR gates 336$a$ and 336$b$, along with the respective RM values from 303$i$ and 308$i$. If $SC_{t-1}$ and RMi 303$a$ (or 308$i$) are different, the output value 337$a$ (or 337$b$) from gate 336$a$ (or 336$b$) is 0, and the desired data are not in storage element 314$i$ (or 316$i$). If $SC_{t-1}$ and RMi 303$i$ (or 308$i$) have the same value, the output value 337$a$ (or 337$b$) from gate 336$a$ (or 336$b$) is 1, and there may be a cache hit in storage element 314$i$ (or 316$i$). Address tag fields 307$i$, 311$i$ and AMID 313$i$ in the directory 310 entry are compared with respective request fields AHIGH 322 and AMID 326 in comparators 332$a$, 332$b$, 334$a$ and 334$b$. If the EXCLUSIVE-NOR output value 336$a$ (or 336$b$) and one of the valid bits 305$i$ (or 309$i$) are both set to ones and the address tags match (AHIGH 322 matches AHIGH 307$i$ or 311$i$; and AMID 224 matches AMID 313$i$) then there is a cache hit. One of the AND gates 338$a$ and 338$b$ will be set to one if there is a hit in respective cache element 314$i$ or 316$i$. When either of these AND gates is set to one, OR gate 342$a$ is sets indicating a cache hit, and the respective data line stored in 314$i$ or 316$i$ is output from D parallel OR gates 342$b$, where D is the number of bits in the data field.

It is understood by those skilled in the art that the embodiment of FIG. 5 may be employed in virtually placed caches. In a virtually placed cache, the cache request comes directly from processor 340 via lines 320$a$ and 320$b$, not from the DLAT 360. The processor 360 provides the virtual address high order bits to comparators 332$a$–$b$ and the middle bits to comparators 334$a$–$b$. The address translation is done in parallel with the cache directory lookup. The real address produced by the DLAT is compared with the address tag output by the directory 310 and if they match, there is a hit.

The embodiment of FIG. 5 with virtual placement may also be varied, so that some of the translatable bits of the virtual address are used to identify the congruence class. For example, if the same cache 300 described above (with 128 congruence classes and 128 bytes per line) is used in a system in which the virtual page size is 4096 bytes, 2 untranslated bits are used to identify the congruence class. The virtual address only includes 12 bits which do not require translation. But as described above, 14 bytes are required to uniquely identify a congruence class in cache 300. In other words, there are synonym classes inherent in the system.

When untranslated bits are used to address the cache, several methods may be used to correctly store and fetch data. Both the hit ratio and coherence are considerations in choosing a method. One method is to increase the size of the cache directory 310, so that each row 380a–n of the directory includes all of the congruence classes within the same synonym class as the desired congruence class. Each time a congruence class is interrogated to look for an address tag AHIGH, the other congruence classes in the same synonym class would also be checked. For the case where there are four congruence classes in each synonym class, this would mean quadrupling the size (i.e. the number of columns in each entry 380a–n) of the directory. Although this method has a high hit ratio and ensures coherence, it increases hardware costs.

A second method would include address tag compares for all of the congruence classes in the synonym class, for every request. This method also ensures coherence, but it slows down response time since additional accesses to the directory are made. The impact on response time can be reduced by only checking all of the congruence classes within the synonym class during store operations. On fetch operations, if the first address tag compare shows a hit, then the remaining congruence classes within the synonym class are not checked for the presence of the data. In most cases, the desired data are found on the first cache access. If the data are not found on the first access, then the remaining congruence classes in the synonym class are checked sequentially until either a hit is detected or all of the congruence classes within the synonym class have been checked without an address tag match, in which case there is genuinely a cache miss. This method requires more complex hardware to implement.

A third method is to just treat the virtual address like a real address. If there is no address tag match in the congruence class selected by the low order (not requiring translation) and middle order (requiring translation, but not translated) bits, then the reference is treated as a cache miss; other congruence classes in the same synonym class are not checked. This is simple to implement, but has a higher miss ratio.

Those skilled in the art will recognize that other known synonym detection techniques used during fetch operations in conventional synonym detection systems for virtual-placed caches may be modified and adapted for use, in conjunction with congruence class remappping as discussed with reference to the embodiments of FIGS. 2 and 5.

Another variation of the embodiment of FIG. 5 includes within each directory 310 entry 380a–n a separate AMID field (not shown) for each set within the associated congruence class. If each synonym class includes more than two congruence classes (i.e., AMID includes at least two bits), then a single congruence class could store remapped data from more than one failed congruence class. The individual AMID fields in the entry would identify the failed class from which the data in each set are remapped.

It is understood by one skilled in the art that many variations of the embodiments described herein are contemplated. While the invention has been described in terms of exemplary embodiments, it is contemplated that it may be practiced as outlined above with modifications within the spirit and scope of the appended claims.

What is claimed:

1. In a cache unit adapted for use with a memory used for storing a plurality of data values in a digital processor system, a method for storing said plurality or data values in said memory using said cache trait, said cache trait including:

a plurality of congruence classes each for storing a different one of said plurality of data values in said cache unit, and a synonym class including ones of said plurality of congruence classes, each of said ones of said congruence classes addressed by a first address field which is identical in each of said ones of said congruence classes and a second address field which differs in each of said ones of said congruence classes, wherein at least one of said plurality of congruence classes included in said synonym class is an inoperative congruence class, the method comprising the steps of:
   (a) determining that one of said plurality of congruence classes is said inoperative congruence class;
   (b) selecting a further one of said plurality of congruence classes included in said synonym class as an alternate congruence class to substitute for said inoperative congruence class;
   (c) storing a synonym class data value in a location associated with said inoperative congruence class to identify said inoperative congruence class as being inoperative;
   (d) storing a further data value in a further location associated with said inoperative congruence class to identify said alternate congruence class as a substitute for said inoperative congruence class;
   (e) storing a congruence class data value in a location associated with said alternate congruence class to identify said alternate congruence class as said alternate congruence class;
   (f) initiating storage of one of said plurality of data values to a memory location in said memory;
   (g) determining that said one of said plurality of data values is intended to be stored in a cache location in said cache unit corresponding to said memory location if, in step (f) a cache hit results, wherein said cache location is said inoperative congruence class;
   (h) storing said one of said plurality of data values into said alternate congruence class by accessing said further data value in said further location associated with said inoperative congruence class;
   (i) transferring said one of said plurality of data values from said alternate congruence class to said memory location which corresponds to said inoperative congruence class;
   (j) determining that said one of said plurality of data values is not intended to be stored in said cache unit if in step (f) a cache miss occurs and then performing one of 1) storing said one of said plurality of data values in said memory without storing said one of said plurality of data values in said cache unit and 2) allocating said cache location in said cache unit to receive said one of said plurality of data values.

2. A method in accordance with claim 1, in which the cache unit has a cache directory with a plurality of entries, further comprising the step of setting an indicator within said cache directory in one of said entries which is associated with said alternate congruence class when said data are stored in said alternate congruence class.

3. A method in accordance with claim 1, further comprising the steps of:
   (g) identifying a further request to retrieve said data from said inoperative congruence class; and
   (h) retrieving said data from said alternate congruence class in response to said further request.

4. A method in accordance with claim 3 in which the system has a cache directory with a plurality of entries, each entry associated with a respective one of said plurality of congruence classes, in which step (h) comprises the steps of:

selecting one of said entries which is associated with said disabled congruence class;

retrieving from said selected entry a value which identifies a further entry that is associated with said alternate congruence class;

determining whether said further entry contains a value associated with said inoperative congruence class; and fetching said data from said alternate congruence class only if said field contains said value associated with said disabled congruence class.

5. A method in accordance with claim 1 which includes the further steps of:

using a real address to determine, for which congruence class, storage is requested when transferring said data to said cache unit; and using said real address to determine from which congruence class said data is subsequently retrieved.

6. A method in accordance with claim 1 which includes the further steps of:

using a virtual address to determine, for which congruence class, storage is requested when transferring said data to said cache unit; and using said virtual address to determine from which congruence class said data are subsequently retrieved.

7. A cache unit for providing rapid access to a memory used for storing a plurality of data values, said cache unit comprising:

(a) congruence class means including a plurality of congruence classes, (b) synonym class means including a synonym class, said synonym class including ones of said plurality of congruence classes, each of said ones of said congruence classes addressed by a first address field which is identical in each of said ones of said congruence classes and a second address field which differs in each of said ones of said congruence classes;

(c) identifying means for determining that one of said plurality of congruence classes is an inoperative congruence class;

(d) means for selecting a further one of said congruence classes included in said synonym class as an alternate congruence class to substitute for said inoperative congruence class;

(e) storage means including a location associated with said inoperative congruence class for receiving a synonym class data value which identifies said inoperative congruence class as being inoperative;

(f) further storage means, including a further location associated with said inoperative congruence class, for receiving a further data value which identifies said alternative congruence class as a substitute for said inoperative congruence class;

(g) means for storing a congruence class data value in a location associated with said alternate congruence class to identify said alternate congruence class as said alternate congruence class;

(h) means for initiating storage of one of said plurality of data values to a memory location in said memory;

(i) means for determining that said one of said plurality of data values is intended to be stored in a cache location in said cache unit corresponding to said memory location if a cache hit results, wherein said cache location is said inoperative congruence class;

(j) means, responsive to said cache hit, for storing one of said plurality of said data values into said alternate congruence class;

(k) means for transferring said one of said plurality of data values from said alternate congruence class to said memory location which corresponds to said inoperative congruence class; and (l) means for determining that said one of said plurality of data values is not intended to be stored in said cache unit and for then performing one of 1) storing said one of said plurality of data values in said memory without storing said one of said plurality of data values in said cache unit if a cache miss occurs and 2) allocating said cache location in said cache unit to receive said one of said plurality of data values.

8. A system in accordance with claim 7, wherein said cache unit is a direct mapped cache.

9. A system in accordance with claim 7, wherein said cache unit is a set-associative cache.

10. A system for addressing data in a cache memory which has a plurality of synonym classes, each of said synonym classes having a plurality of congruence classes, following a failure which disables at least one of said congruence classes wherein said cache memory is used with a memory used for storing a plurality of data values, comprising:

identifying means for identifying said disabled congruence class;

means responsive to said identifying means for selecting an alternate congruence class from a subset of said plurality of congruence classes which are in the same synonym class as said disabled congruence class;

a cache directory which includes a plurality of entries, each respective entry associated with a respective congruence class which is used for storing a different one of said plurality of data values in said cache memory, each entry comprising:

(a) a first indicator which indicates whether said associated congruence class is disabled;

(b) a second indicator which indicates whether said associated congruence class contains data remapped from a further congruence class which is disabled;

(c) an address tag field which identifies a respective datum which is stored in said associated congruence class; and (d) a further field which identifies an alternate congruence class in which said datum is stored as said alternate congruence class if said associated congruence class is disabled; and means for setting said first and second indicator, said address tag field and said further field associated with said disabled congruence class so as to remap access to said respective datum into said alternate congruence class;

means for initiating storage of one of said plurality of data values to a memory location in said memory and for determining that said one of said plurality of data values is intended to be stored in a cache location in said cache unit corresponding to said memory location if a cache hit results, wherein said cache location is said disabled congruence class;

means for transferring said one of said plurality of data values from said alternate congruence class to said memory location which corresponds to said inoperative congruence class; and means for determining that said one of said plurality of data values is not intended to be stored in said cache unit and for then performing one of 1) storing said one of said plurality of data values in said memory without storing said one of said plurality of data values in said cache unit if a cache miss occurs and 2) allocating said cache location in said cache unit to receive said one of said plurality of data values.

11. A system in accordance with claim 10, further comprising means for storing a line of data in said alternate congruence class in response to a request to store said line of data in said disabled congruence class if said first indicator is set in one of said entries which is associated with said disabled congruence class.

12. A system in accordance with claim 11, further comprising means for retrieving said line of data from said alternate congruence class if said first indicator is set in one of said entries which is associated with said disabled congruence class, and said second indicator is set in a further one of said entries which is associated with said alternate congruence class.

* * * * *

UNITED STATES PATENT AND TRADE MARK OFFICE
CERTIFICATE OF CORRECTION

PATENT NO.   : 5,584,002
DATED            : December 10, 1996
INVENTOR(S) : Emma et al.

It is certified that error appears in the above-identified patent and that said Letters Patent is hereby corrected as shown below:

In column 4, line 48, delete the word "sequenced" and insert --sequence,--.

In column 5, line 4, delete the word "than" and insert the word --then--.

In column 6, line 3, after the word "created" insert a comma --,--.

In column 7, line 3, delete the comma "," after the word "with".

In column 9, lines 20-21, delete the sentence "The value of AMID associated."

In column 10, line 37, delete the word "ones" and insert --one,--.

In column 10, line 42, delete the word "sets" and insert --set,--.

In column 12, line 1, delete both occurrences of the word "trait" and insert the word --unit--.

Signed and Sealed this

Thirteenth Day of May, 1997

*Attest:*

BRUCE LEHMAN

*Attesting Officer*     *Commissioner of Patents and Trademarks*